(12) United States Patent
Zhu et al.

(10) Patent No.: US 10,302,677 B2
(45) Date of Patent: May 28, 2019

(54) MULTIPLE PIN PROBES WITH SUPPORT FOR PERFORMING PARALLEL MEASUREMENTS

(71) Applicant: KLA-Tencor Corporation, Milpitas, CA (US)

(72) Inventors: Nanchang Zhu, Shanghai (CN); Zhubin Shi, Shanghai (CN)

(73) Assignee: KLA-Tencor Corporation, Milpitas, CA (US)

( * ) Notice: Subject to any disclaimer, the term of this patent is extended or adjusted under 35 U.S.C. 154(b) by 150 days.

(21) Appl. No.: 15/139,883

(22) Filed: Apr. 27, 2016

(65) Prior Publication Data
US 2016/0320430 A1 Nov. 3, 2016

Related U.S. Application Data

(60) Provisional application No. 62/154,233, filed on Apr. 29, 2015.

(51) Int. Cl.
*G01R 31/20* (2006.01)
*G01R 31/02* (2006.01)
(Continued)

(52) U.S. Cl.
CPC .............. *G01R 1/073* (2013.01); *G01R 27/14* (2013.01); *G01R 31/2601* (2013.01);
(Continued)

(58) Field of Classification Search
CPC ...... G01R 27/02; G01R 27/14; G01R 27/205; G01R 31/2601; G01R 31/2648;
(Continued)

(56) References Cited

U.S. PATENT DOCUMENTS 6,246,245 B1 6/2001 Akram et al.
6,927,569 B2 8/2005 Worledge et al.
(Continued)

FOREIGN PATENT DOCUMENTS

| EP | 0974845 A1 | 1/2000 |
| WO | 00-03252 A2 | 1/2000 |

OTHER PUBLICATIONS

Li Gao Spin polarized current phenomena in magnetic tunnel junctions Sep. 2009 http://snow.stanford.edu/thesis/Gao.pdf.
(Continued)

*Primary Examiner* — Minh N Tang
(74) *Attorney, Agent, or Firm* — Suiter Swantz pc llo

(57) ABSTRACT

Multiple pin probes and methods for controlling such multiple pin probes to support parallel measurements are disclosed. The method may include: establishing electrical contact between a multiple pin probe and a subject of measurement; selecting two pins out of a plurality of pins included in the multiple pin probe as current-carrying pins; selecting more than two additional pins out of the plurality of pins included in the multiple pin probe as voltage-metering pins; injecting a current through the current-carrying pins; simultaneously measuring voltage signals through the voltage-metering pins; calculating a simulated voltage distribution curve at least partially based on the voltage signals simultaneously measured through the voltage-metering pins; and determining one or more processor monitor parameters of the subject of measurement at least partially based on the simulated voltage distribution curve.

20 Claims, 3 Drawing Sheets

(51) Int. Cl.
*G01R 1/073* (2006.01)
*G01R 27/14* (2006.01)
*G01R 31/26* (2014.01)
G01R 19/00 (2006.01)
G01R 33/09 (2006.01)

(52) U.S. Cl.
CPC ...... *G01R 19/0084* (2013.01); *G01R 31/2648* (2013.01); *G01R 33/098* (2013.01)

(58) Field of Classification Search
CPC ............ G01R 31/2608; G01R 31/2621; G01R 31/2831; G01N 27/041; G01N 27/20
See application file for complete search history.

(56) References Cited

U.S. PATENT DOCUMENTS

| | | | |
|---|---|---|---|
| 7,271,606 | B1 | 9/2007 | Tang et al. |
| 7,323,890 | B2 | 1/2008 | Petersen et al. |
| 7,894,248 | B2 | 2/2011 | Yu et al. |
| 8,331,212 | B2 | 12/2012 | Li et al. |
| 2003/0175945 | A1 | 9/2003 | Thompson et al. |
| 2004/0051522 | A1* | 3/2004 | Worledge ............. G01R 33/093 324/230 |
| 2008/0290882 | A1 | 11/2008 | Rogers et al. |
| 2009/0085592 | A1 | 4/2009 | Cooper et al. |
| 2012/0027058 | A1 | 2/2012 | Lynch et al. |
| 2012/0326712 | A1 | 12/2012 | Tudosa et al. |
| 2014/0064322 | A1 | 3/2014 | Maksymovych |
| 2015/0061714 | A1* | 3/2015 | Kelly-Morgan ....... G01N 27/00 324/754.11 |

OTHER PUBLICATIONS

Hitoshi Kubota Quantitative measurement of voltage dependence of spin-transfer torque in MgO-based magnetic tunnel junctions 1National Institute of Advanced Industrial Science and Technology (AIST), Nanoelectronics Research Institute (NeRI) Nov. 25, 2007 http://kentlab3.physics.nyu.edu/paper/Kubota_quantitative_2008.pdf Lars E. Bengtsson a microcontroller-based lock-in amplifier for sub-milliohm resistance measurements Department of Physics, University of Gothenburg Jul. 6, 2012 http://physics.gu.se/~larsbn/Publikationer/pub4_2012.pdf Peter Folmer Nielsen Microprobe Metrology for direct Sheet Resistance and Mobility characterization http://www.capres.com/files/billeder/iwjt2012.pdf.

International Search Report for Application No. PCT/US2016/029818 dated Jul. 29, 2016, 3 pages.

* cited by examiner

MULTIPLE PIN PROBES WITH SUPPORT FOR PERFORMING PARALLEL MEASUREMENTS

CROSS-REFERENCE TO RELATED APPLICATIONS

The present application claims the benefit under 35 U.S.C. § 119(e) of U.S. Provisional Application Ser. No. 62/154,233, filed Apr. 29, 2015. Said U.S. Provisional Application Ser. No. 62/154,233 is hereby incorporated by reference in its entirety.

TECHNICAL FIELD

The disclosure generally relates to the field of measurement devices, and particularly to measurement devices using multiple pin probes.

BACKGROUND

A multiple pin probe is a probe that includes multiple pins. A measurement technique commonly referred to as current in-plane tunneling, or CIPT, uses multiple pin probes to take measurements of magnetic tunnel junction resistance.

More specifically, current in-plane tunneling takes measurements in multiple measurement steps. Each measurement step commences by selecting four of the pins in a multiple pin probe. Two of the selected pins are coupled to current sources and the other two of the selected pins are coupled to voltage meters. Current is passed through the two current-carrying pins and voltage is measured through the two voltage-metering pins. This measurement step is then repeated multiple times (with different selection/coupling of four pins in each measurement step) to extract the magnetic tunnel junction resistance.

It is noted that the repetitive nature of the current in-plane tunneling measurement process means that the measurement steps are performed at different times. It also requires a relative long period of time to complete the measurement process (e.g., in eight or more measurement steps), during which the pins may change positions, leading to measurement variations and inaccuracies.

SUMMARY

An embodiment of the present disclosure is directed to a system. The system may include a multiple pin probe having N-number of pins, where N is greater than four. The system may also include a control circuit configured to measure a subject of measurement utilizing the multiple pin probe. The control circuit may be configured to: select two current-carrying pins out of the N-number of pins included in the multiple pin probe; select more than two voltage-metering pins out of the N-number of pins included in the multiple pin probe; inject a current through the two current-carrying pins; simultaneously measure voltage signals through the more than two voltage-metering pins; calculate a simulated voltage distribution curve at least partially based on the voltage signals simultaneously measured through the more than two voltage-metering pins; and determine one or more processor monitor parameters of the subject of measurement at least partially based on the simulated voltage distribution curve.

A further embodiment of the present disclosure is directed to a system. The system may include a multiple pin probe having N-number of pins, where N is greater than four. The system may also include a control circuit configured to measure junction parameters of a subject of measurement utilizing the multiple pin probe. The control circuit may be configured to: select two current-carrying pins out of the N-number of pins included in the multiple pin probe; select more than two voltage-metering pins out of the N-number of pins included in the multiple pin probe; inject a current through the two current-carrying pins; simultaneously measure voltage signals through the more than two voltage-metering pins; calculate a simulated voltage distribution curve at least partially based on the voltage signals simultaneously measured through the more than two voltage-metering pins; and extracting one or more junction parameters of the subject of measurement at least partially based on the simulated voltage distribution curve.

An additional embodiment of the present disclosure is directed to a method. The method may include: establishing electrical contact between a multiple pin probe and a subject of measurement; selecting two pins out of a plurality of pins included in the multiple pin probe as current-carrying pins; selecting more than two additional pins out of the plurality of pins included in the multiple pin probe as voltage-metering pins; injecting a current through the current-carrying pins; simultaneously measuring voltage signals through the voltage-metering pins; calculating a simulated a voltage distribution curve at least partially based on the voltage signals simultaneously measured through the voltage-metering pins; and determining one or more processor monitor parameters of the subject of measurement at least partially based on the simulated voltage distribution curve.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Embodiments in accordance with the present disclosure are directed to multiple pin probes and methods for controlling such multiple pin probes to support parallel measurements. It is contemplated that performing parallel measurements helps improve measurement efficiency and accuracy.

Figure 1:
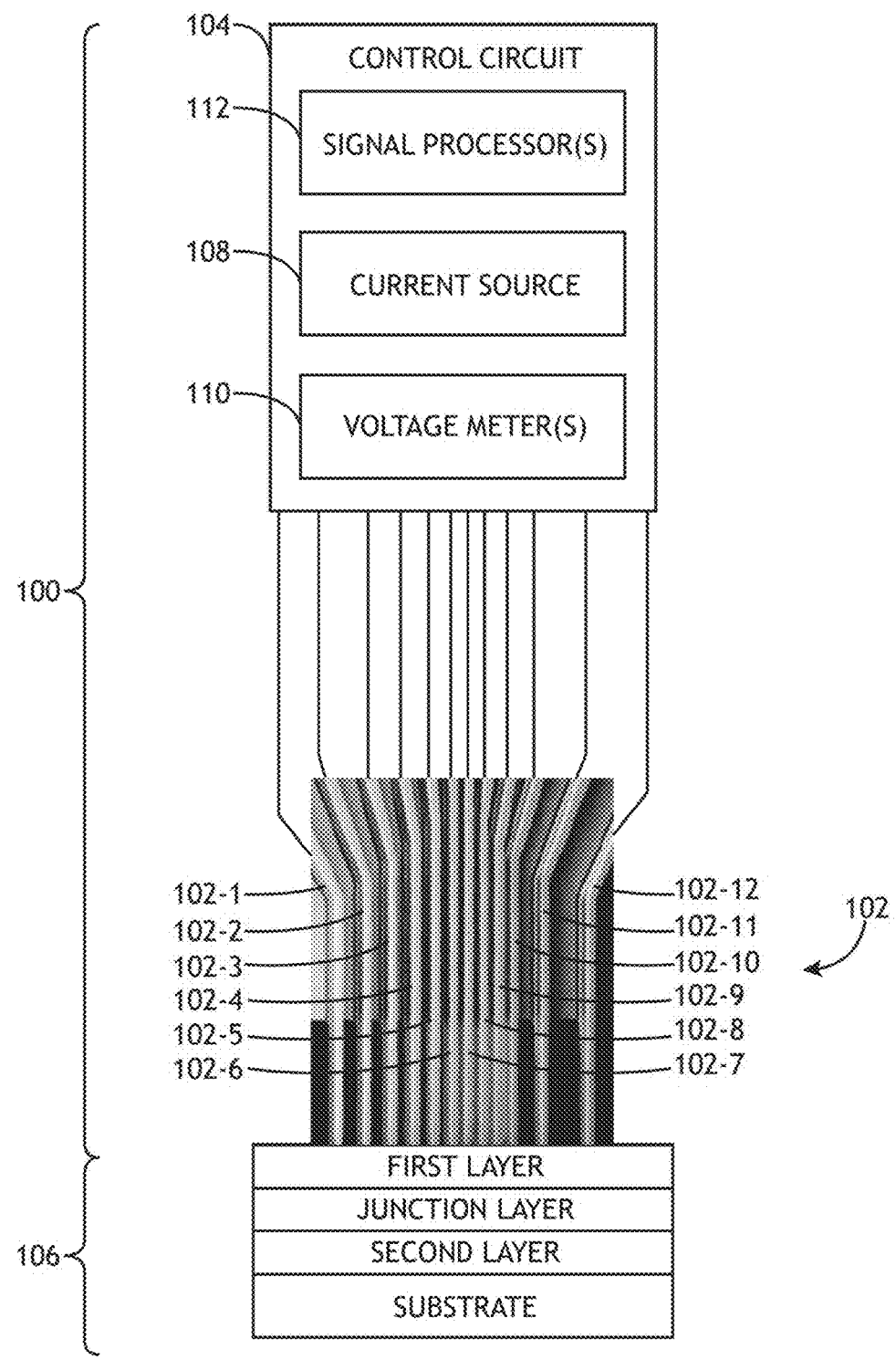
FIG. 1 is a block diagram depicting a measurement system configured in accordance with an embodiment of the present disclosure.
Figure 2:
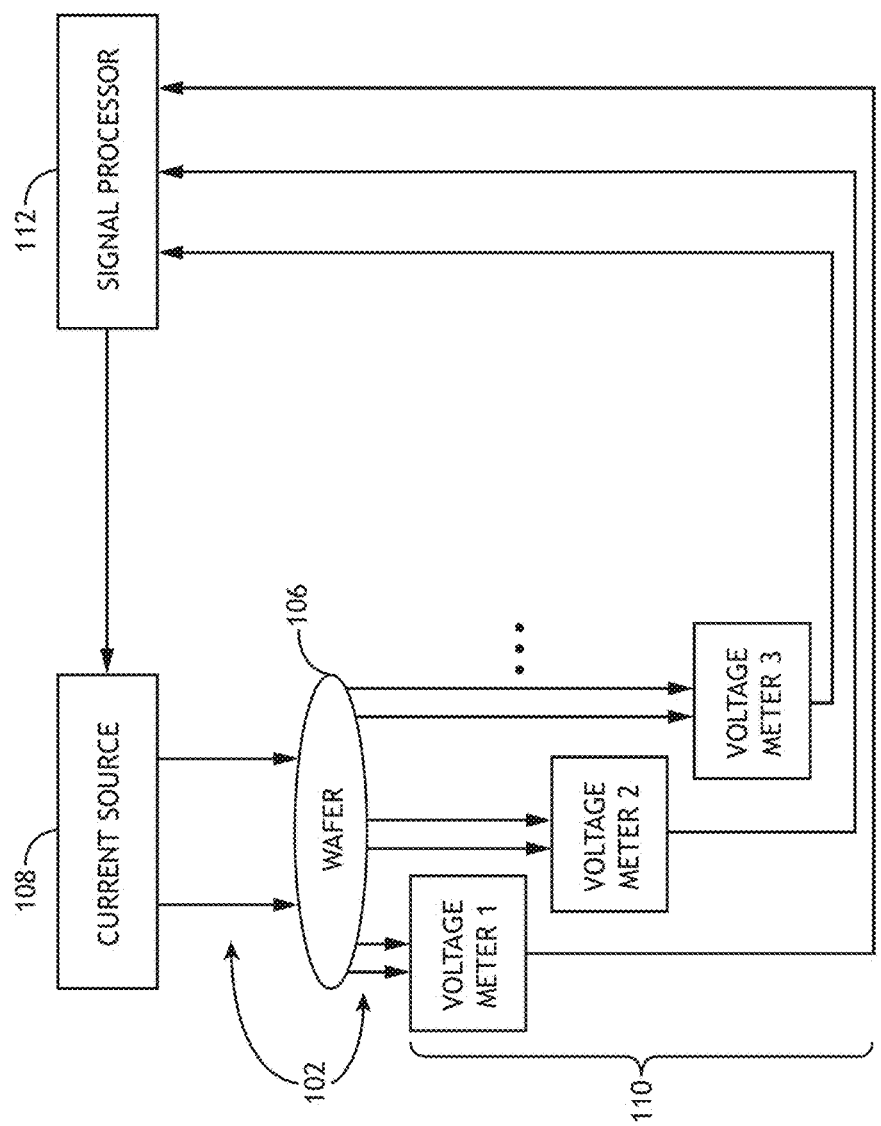
FIG. 2 is another block diagram depicting the measurement system configured in accordance with an embodiment of the present disclosure.

Referring generally to FIGS. 1 and 2, simplified block diagrams of a measurement system 100 configured in accordance with an embodiment of the present disclosure are shown. It is noted that the block diagrams shown in FIGS. 1 and 2 have been simplified for illustrative purposes. It is to be understood that the measurement system 100 may utilize various types of amplifiers, filters, signal converters, and/or gain controllers along the signal paths as needed without departing from the spirit and scope of the present disclosure.

The measurement system 100 configured in accordance with an embodiment of the present disclosure includes a multiple pin probe 102 communicatively coupled with a control circuit 104. The multiple pin probe 102 includes N-number of pins, where N is greater than 4. In some embodiments, the multiple pin probe 102 may include 12 pins denoted as pins 102-1 through 102-12 in FIG. 1. The distances between adjacent pins in the multiple pin probe 102 may be non-uniform and may vary from relatively narrow (e.g., in the order of 1 μm) to relatively wide (e.g., in the order of 10 μm or greater). It is to be understood that the 12-pin configuration depicted in FIG. 1 is merely exemplary and is not meant to be limiting. It is contemplated that the multiple pin probe 102 may include different numbers of pins, and the pins may be spaced at various distances apart from each other, without departing from the spirit and scope of the present disclosure.

While specific implementations of the multiple pin probe 102 may vary, it is noted that the pins of the multiple pin probe 102 are configured in a manner that allows them to simultaneously contact a subject of measurement (e.g., a wafer) 106 during a measurement process. Allowing the pins of the multiple pin probe 102 to simultaneously contact the wafer 106 enables the multiple pin probe 102 to support parallel measurements of the wafer 106. Performing multiple measurements in parallel may lead to improved measurement efficiency and accuracy.

In some embodiments, the control circuit 104 of the multiple pin probe 102 is configured (e.g., using a multiplexer or the like) to select two of the N-number of pins as current-carrying pins. The control circuit 104 may couple the two current-carrying pins to a current source 108 and couple the rest of the pins (up to N-2 of them) to multiple voltage meters 110 (with respect to a common ground, or a common pin). This coupling allows the voltages to be measured simultaneously at multiple voltage meters 110 when a current is injected, effectively performing multiple measurements in parallel.

More specifically, for illustrative purposes, suppose the pins 102-5 and 102-8 shown in FIG. 1 are selected to be current-carrying pins. The control circuit 104 may couple the pins 102-5 and 102-8 to the current source 108 and couple the other ten pins (102-1 through 102-4, 102-6, 102-7, and 102-9 through 102-12) to their respective voltage meters 110. It is noted that because the pins 102-1 through 102-4, 102-6, 102-7, and 102-9 through 102-12 (collectively referred to as voltage-metering pins) are distributed at variable distances away from the current-carrying pins (with some voltage-metering pins very close to the current-carrying pins and some far away from the current-carrying pins), the voltages measured at the various voltage meters 110 may provide adequate information to help a signal processor 112 (which may include one or more dedicated processing devices, application-specific integrated circuits (ASICs), digital signal processors (DSPs), field-programmable gate arrays (FPGAs), or various other types of processors or processing devices) to extract tunneling junction resistance of the top (first) layer, the junction layer, and/or the bottom (second) layer of the wafer 106 all at once.

Figure 3:
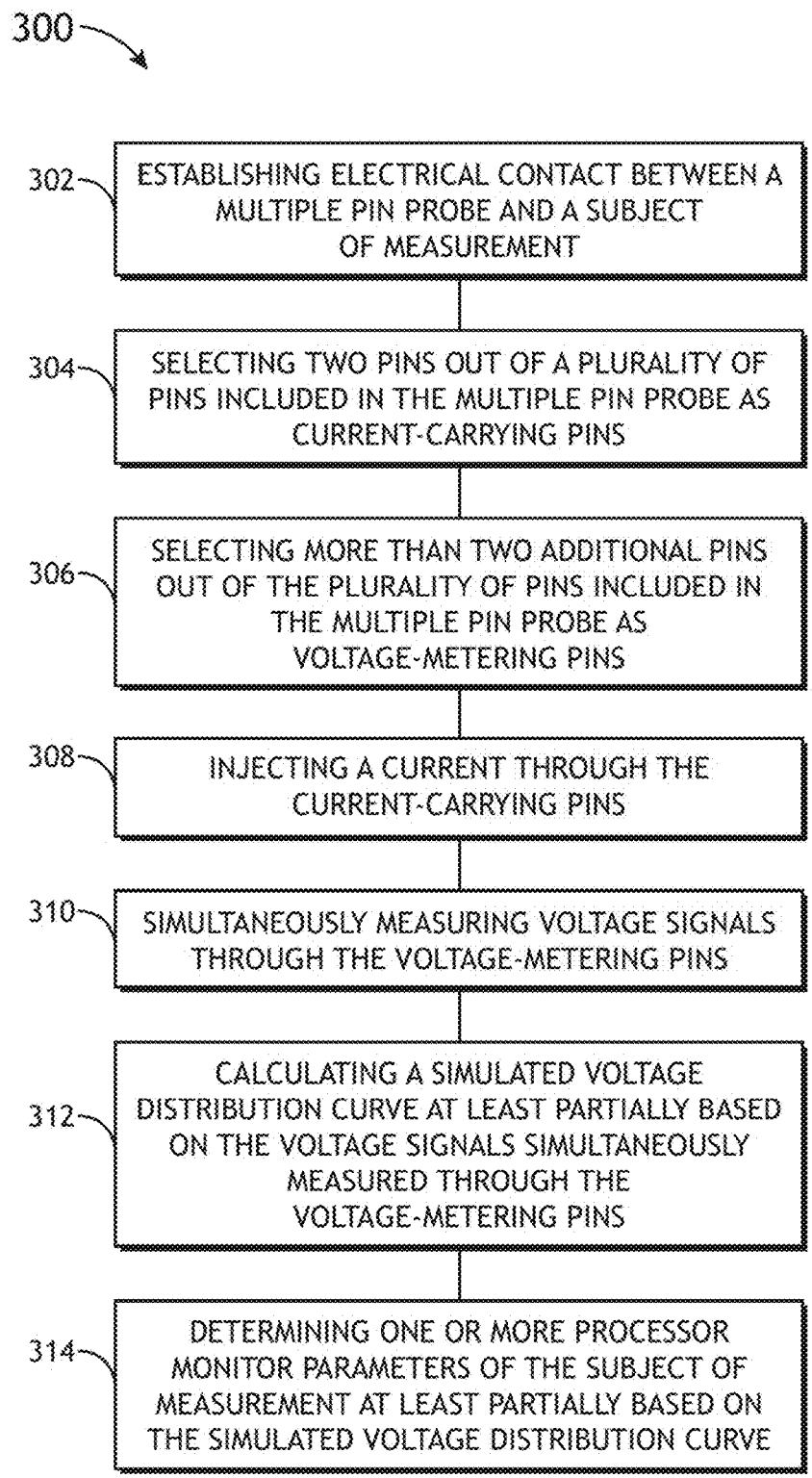
FIG. 3 is a flow diagram depicting a measurement method configured in accordance with an embodiment of the present disclosure.

FIG. 3 is a more detailed flow diagram depicting the parallel measurement process/method 300 performed using the multiple pin probe 102. As shown in FIG. 3, electrical contact between the multiple pin probe 102 and the surface of the wafer 106 is established in a step 302. Two of the pins in the multiple pin probe 102 are selected as current-carrying pins, which are coupled to the current source 108 in a step 304. At least some (or all) of the rest of the pins in the multiple pin probe are selected as voltage-metering pins, which are coupled to one or more voltage meters 110 in a step 306. In some embodiments, the voltage meters may include one or more lock-in amplifiers. It is contemplated, however, that the implementations of the voltage meters may vary without departing from the spirit and scope of the present disclosure.

With the current-carrying pins and the voltage-metering pins selected, a predefined current can be injected through the current-carrying pins in a step 308. Voltage signals can be metered in a step 310, and the voltage signals in terms of amplitude and phase angle (I,Q) can be read out simultaneously for the various voltage-metering pins distributed around the current-carrying pins. The results obtained in the step 310 can then be utilized in a step 312 to calculate a simulated voltage distribution curve with junction parameters (e.g., resistance of the top layer, the junction layer, and/or the bottom layer), probe parameters (e.g., spacing, spacing deviation, contact size and contact conductivity), as well as various other types of parameters (e.g., including test pad parameter indicating whether it is a monitor wafer without pad size limitation, or it is a limited pad size or the like). Values of some of these parameters (e.g., the junction parameters) can be determined based on the simulated voltage distribution curve and reported as process monitor parameters in a step 314.

It is noted that by effectively performing multiple measurements in parallel, the measurement method 300 is able to shorten the measurement time. The measurement method 300 is also able to reduce measurement errors caused by probe spacing vibrations. The measurement method 300 may further prolong the lifetime of the multiple pin probe (due to reduced contact time) and may reduce the current distribution range requirement for measurement on small pads.

It is noted that the measurement method 300 can also be configured to repeat the steps 304 through 312 more than once. In some embodiments, different current-carrying pins and voltage-metering pins are selected when the steps 304 through 312 are repeated to obtain one or more additional voltage distribution curves. These additional voltage distribution curves can be used for arbitrary probe position error correction in the fitting process, which may further improve the measurement accuracy. In some embodiments, pins that are selected as current-carrying pins are also selected as voltage-metering pins at some point during the measurement process.

Furthermore, in some embodiments, selection of the current-carrying pins is limited to be around the middle pins of the multiple pin probe 102. Such a limitation may help reduce the voltage distribution area, allowing the multiple pin probe 102 to be better suited for measuring a finite size pad on a patterned wafer. Alternatively, in some embodiments, pins that are spaced farther apart from each other may be selected as the current-carrying pins, and the pins located between the current-carrying pins may be selected as the voltage-metering pins. In some embodiments, sample size effect and probe contact size effect can be simulated and utilized to modify the voltage distribution, which may help further improve the measurement accuracy and prolong the lifetime of the multiple pin probe 102.

It is contemplated that the advantages provided by the measurement systems and the measurement methods configured in accordance with the present disclosure may be appreciated in various applications. It is contemplated that while some of the examples above referred to certain specific parameters (e.g., the junction parameters), the systems and methods configured in accordance with the present disclosure are applicable to obtain measurements of other types of parameters without departing from the spirit and scope of the present disclosure. In addition, it is contemplated that the term "wafer" used in the present disclosure may include a thin slice of semiconductor material used in the fabrication of integrated circuits and other devices, as well as other thin polished plates such as magnetic disc substrates, gauge blocks and the like.

It is contemplated that the measurement methods configured in accordance with the present disclosure may be implemented in various measurement tools as sets of instructions executed by one or more processors, through a single production device, and/or through multiple production devices. Further, it is understood that the specific order or hierarchy of steps in the methods disclosed are examples of exemplary approaches. Based upon design preferences, it is understood that the specific order or hierarchy of steps in the method can be rearranged while remaining within the scope and spirit of the disclosure. The accompanying method claims present elements of the various steps in a sample order, and are not necessarily meant to be limited to the specific order or hierarchy presented.

It is believed that the systems and methods of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:

1. A system, comprising:
a multiple pin probe having N-number of pins, where N is greater than four; and
a control circuit configured to measure a subject of measurement utilizing the multiple pin probe, the control circuit configured to:
perform a first voltage signal measurement with a first multiple pin probe configuration, wherein the control circuit is configured to:
select a first set of two current-carrying pins out of the N-number of pins included in the multiple pin probe;
select a first set of three or more voltage-metering pins out of the N-number of pins included in the multiple pin probe;
inject a current through the first set of two current-carrying pins;
simultaneously measure voltage signals through the first set of three or more voltage-metering pins; and
calculate a first voltage distribution curve based on the voltage signals simultaneously measured through the first set of three or more voltage-metering pins;
perform a second voltage signal measurement with a second multiple pin probe configuration, wherein the control circuit is configured to:
select a second set of two current-carrying pins out of the N-number of pins included in the multiple pin probe;
select a second set of three or more voltage-metering pins out of the N-number of pins included in the multiple pin probe;
inject a current through the second set of two current-carrying pins;
simultaneously measure voltage signals through the second set of three or more voltage-metering pins; and
calculate a second voltage distribution curve based on the voltage signals simultaneously measured through the second set of three or more voltage-metering pins;
correct for arbitrary probe position error of the multiple pin probe based on the first voltage distribution curve and the second voltage distribution curve; and
determine one or more process monitor parameters of the subject of measurement at least partially based on the first voltage distribution curve and the second voltage distribution curve.

2. The system of claim 1, wherein a distance between a first pin and a second pin adjacent to the first pin is a first distance and a distance between a third pin and a fourth pin adjacent to the third pin is a second distance, wherein the first distance is different than the second distance.

3. The system of claim 1, wherein the first set of three or more voltage-metering pins and the second set of three or more voltage-metering pins include all N-number of pins included in the multiple pin probe except for the two current-carrying pins.

4. The system of claim 3, wherein the multiple pin probe includes 12 pins.

5. The system of claim 1, wherein the control circuit comprises a plurality of voltage meters configured to simultaneously measure voltage signals through the first set of three or more voltage-metering pins and the second set of three or more voltage-metering pins.

6. The system of claim 5, wherein the plurality of voltage meters includes a plurality of lock-in amplifiers operating in parallel.

7. The system of claim 1, wherein the control circuit is further configured to:
change selections of the two current-carrying pins and the three or more voltage-metering pins to perform a third voltage signal measurement with a third multiple pin probe configuration.

8. A system, comprising:
a multiple pin probe having N-number of pins, where N is greater than four; and
a control circuit configured to measure junction parameters of a subject of measurement utilizing the multiple pin probe, the control circuit configured to:
perform a first voltage signal measurement with a first multiple pin probe configuration, wherein the control circuit is configured to:
select a first set of two current-carrying pins out of the N-number of pins included in the multiple pin probe;
select a first set of three or more voltage-metering pins out of the N-number of pins included in the multiple pin probe;
inject a current through the first set of two current-carrying pins;

simultaneously measure voltage signals through the first set of three or more voltage-metering pins; and calculate a voltage distribution curve based on the voltage signals simultaneously measured through the first set of three or more voltage-metering pins;

perform a second voltage signal measurement with a second multiple pin probe configuration, wherein the control circuit is configured to:

select a second set of two current-carrying pins out of the N-number of pins included in the multiple pin probe;

select a second set of three or more voltage-metering pins out of the N-number of pins included in the multiple pin probe;

inject a current through the second set of two current-carrying pins;

simultaneously measure voltage signals through the second set of three or more voltage-metering pins; and calculate a second voltage distribution curve based on the voltage signals simultaneously measured through the second set of three or more voltage-metering pins;

correct for arbitrary probe position error of the multiple pin probe based on the first voltage distribution curve and the second voltage distribution curve; and extract one or more junction parameters of the subject of measurement at least partially based on the first voltage distribution curve and the second voltage distribution curve.

9. The system of claim 8, wherein the subject of measurement is a semiconductor wafer, and wherein the one or more junction parameters include a resistance of a junction layer of the semiconductor wafer.

10. The system of claim 8, wherein a distance between a first pin and a second pin adjacent to the first pin is a first distance and a distance between a third pin and a fourth pin adjacent to the third pin is a second distance, wherein the first distance is different than the second distance.

11. The system of claim 8, wherein the first set of three or more voltage-metering pins and the second set of three or more voltage-metering pins include all N-number of pins included in the multiple pin probe except for the two current-carrying pins.

12. The system of claim 11, wherein the multiple pin probe includes 12 pins.

13. The system of claim 8, wherein the control circuit comprises a plurality of voltage meters configured to simultaneously measure voltage signals through the first set of three or more voltage-metering pins and the second set of three or more voltage-metering pins.

14. The system of claim 13, wherein the plurality of voltage meters includes a plurality of lock-in amplifiers operating in parallel.

15. The system of claim 8, wherein the control circuit is further configured to:

change selections of the two current-carrying pins and the three or more voltage-metering pins to perform a third voltage signal measurement with a third multiple pin probe configuration.

16. A method, comprising:

establishing electrical contact between a multiple pin probe and a subject of measurement;

performing a first voltage signal measurement with a first multiple pin probe configuration, wherein performing the first voltage signal measurement comprises:

selecting a first set of two pins out of a plurality of pins included in the multiple pin probe as current-carrying pins;

selecting a first set of three or more additional pins out of the plurality of pins included in the multiple pin probe as voltage-metering pins;

injecting a current through the first set of two current-carrying pins;

simultaneously measuring voltage signals through the first set of three or more voltage-metering pins; and calculating a voltage distribution curve based on the voltage signals simultaneously measured through the first set of three or more voltage-metering pins;

performing a second voltage signal measurement with a second multiple pin probe configuration, wherein performing the second voltage signal measurement comprises:

selecting a second set of two current-carrying pins out of the N-number of pins included in the multiple pin probe;

selecting a second set of three or more voltage-metering pins out of the N-number of pins included in the multiple pin probe;

injecting a current through the second set of two current-carrying pins;

simultaneously measuring voltage signals through the second set of three or more voltage-metering pins; and calculating a second voltage distribution curve based on the voltage signals simultaneously measured through the second set of three or more voltage-metering pins;

correcting for arbitrary probe position error of the multiple pin probe based on the first voltage distribution curve and the second voltage distribution curve; and determining one or more process monitor parameters of the subject of measurement at least partially based on the first voltage distribution curve and the second voltage distribution curve.

17. The method of claim 16, wherein the multiple pin probe includes more than four pins.

18. The method of claim 17, wherein a distance between a first pin and a second pin adjacent to the first pin is a first distance and a distance between a third pin and a fourth pin adjacent to the third pin is a second distance, wherein the first distance is different than the second distance.

19. The method of claim 18, wherein the voltage-metering pins include all of the pins included in the multiple pin probe except for the current-carrying pins.

20. The method of claim 16, further comprising:

performing a third voltage signal measurement with a first multiple pin probe configuration, wherein performing the third voltage signal measurement comprises:

selecting a third set of two pins out of a plurality of pins included in the multiple pin probe as current-carrying pins;

selecting a third set of three or more additional pins out of the plurality of pins included in the multiple pin probe as voltage-metering pins;

injecting a current through the third set of two current-carrying pins;

simultaneously measuring voltage signals through the third set of three or more voltage-metering pins; and calculating a voltage distribution curve based on the voltage signals simultaneously measured through the third set of three or more voltage-metering pins;

correcting for arbitrary probe position error of the multiple pin probe based on the first voltage distribution curve, the second voltage distribution curve, and the third voltage distribution curve; and determining one or more process monitor parameters of the subject of measurement at least partially based on the first voltage distribution curve, the second voltage distribution curve, and the third voltage distribution curve.

\* \* \* \* \*